United States Patent [19]

Mariani et al.

[11] Patent Number: 4,941,133
[45] Date of Patent: Jul. 10, 1990

[54] SAW SLANTED ARRAY CORRELATOR (SAC) WITH SEPARATE AMPLITUDE COMPENSATION CHANNEL

[75] Inventors: Elio A. Mariani, Hamilton Square; William J. Skudera, Jr., Oceanport, both of N.J.

[73] Assignee: The United States of America as represented by the Secretary of the Army, Washington, D.C.

[21] Appl. No.: 373,537

[22] Filed: Jun. 26, 1989

[51] Int. Cl.$^5$ ............................................. H04R 23/00
[52] U.S. Cl. ..................................... 367/140; 333/194; 333/195; 333/154; 310/313 D
[58] Field of Search ................ 367/140, 164; 333/150, 333/154, 193, 194, 195; 310/313 R, 313 D

[56] References Cited

U.S. PATENT DOCUMENTS

| | | | |
|---|---|---|---|
| 3,999,153 | 12/1976 | Borner | 333/195 |
| 4,114,116 | 9/1978 | Reeder | 333/150 |
| 4,126,800 | 11/1978 | Shiokawa et al. | 333/194 |
| 4,203,082 | 5/1980 | Tsukamoto et al. | 333/194 |
| 4,379,274 | 4/1983 | Hansen | 310/313 D |
| 4,427,954 | 1/1984 | Veith et al. | 333/195 |

Primary Examiner—Charles T. Jordan
Assistant Examiner—J. Woodrow Eldred
Attorney, Agent, or Firm—Michael Zelenka; Ann M. Knab

[57] ABSTRACT

A SAW slanted array correlator (SAC) comprises a piezoelectric substrate, an input and an output interdigital transducer deposited on the piezoelectric substrate, a reflective array aligned with the transducers, and an acoustic absorbing film disposed on the substrate between the output transducer and the reflective array. The input and output transducer are slanted at equal and opposite appropriate angles to each other. The reflective array is disposed on the substrate at an angle the same as the angle of emplacement of the output transducer. The transducers comprise a number of interdigital electrodes with varying periodicity, the periodicity being the same for corresponding portions of the two transducers. The reflective array comprises a number of shorted electrodes having a periodicity corresponding to the periodicity of the output transducer. The acoustic absorbing film has a non-uniform width with selected portions having little or no width.

5 Claims, 2 Drawing Sheets

SAW SLANTED ARRAY CORRELATOR (SAC) WITH SEPARATE AMPLITUDE COMPENSATION CHANNEL

The invention described herein may be manufactured, used and licensed by or for the Government without payment to us of any royalty thereon.

TECHNICAL FIELD

This invention relates generally to surface acoustic wave (SAW) dispersive delay-line slanted-array correlators (SAC), and more particularly to SAW-SAC devices with a separate channel for device amplitude error compensation.

BACKGROUND OF THE INVENTION

Surface acoustic wave slanted array correlator (SAW-SAC) devices are ideal choices for implementing wideband compressive receivers for electronic intelligence (ELINT) and electronic support measure (ESM) applications because the SAW-SAC wide bandwidth capability allows the instantaneous sampling of signals over a wide frequency range of several hundred megahertz. These devices can be designed to minimize both frequency domain fresnel ripples (which affect time-domain sidelobes) and the effect of interelectrode reflections. The receiver system's signal sorting performance degrades relative to the design ideal as the amplitude and phase errors in the SAW-SAC device degrade. The residual phase and amplitude errors resulting from fabrication tolerances and design inaccuracies cause the degradation in the time sidelobe performance of the compressed pulse.

Phase compensation in SAW-SAC devices may be achieved by placing a metallized stripe between the input and output transducers. This concept is described in "Phase Compensation of Linear FM Slanted Transducers By Use Of Metallized Stripes" by T.B. Cooper et al. This method has provided a phase error peak reduction of up to 90% resulting in a corresponding reduction in the compressed pulse time-sidelobes. With lower sidelobe levels, better close-in instantaneous dynamic range can be achieved in EW receivers. Although effective methods have been developed for phase compensation for SAW-SAC devices, further reduction of time sidelobes would occur if amplitude errors were minimized independently from phase errors.

SUMMARY OF THE INVENTION

The primary object of the invention is to improve the SAW-SAC device time-sidelobe performance.

It is an object of the invention to provide a SAW-SAC device having separate phase and amplitude correction channels.

It is a still further object of the invention to minimize the amplitude errors associated with SAW-SAC devices in order to achieve better time-sidelobe performance.

The above and other object are achieved in accordance with the invention wherein input and output transducers are aligned on a piezoelectric substrate, and slanted at equal and opposite angles to each other. Each transducer comprises a plurality of interdigital electrodes where the periodicity of which varies in a predetermined manner along the length of the transducer; the periodicity is the same for corresponding portions of each transducer. A reflective array is aligned parallel with the output interdigital transducers and positioned on the substrate at a distance equal to $N\lambda/2$ (where N is an integer and $\lambda$ is the acoustic wavelength) from the output transducer on the side adjacent to the output transducer (as shown in FIG. 1). The reflective array comprises a plurality of shorted electrodes with a periodicity corresponding to the periodicity of the output transducer. An acoustic absorbing film is aligned on the substrate intermediate between the output transducer and the reflective array. The acoustic absorbing film is of constant thickness and has a non-uniform width profile.

In operation, a signal will be propagated in the SAW-SAC device from the input transducer to the output transducer where the signal is partially transferred to the electrical load (i.e. output), partially reflected back to the input, and partially transmitted through the output transducer. The portion of the signal transmitted through the output transducer will become absorbed or attenuated by the acoustic absorbing film. At locations where the absorbing film has little or no width, the signal will continue to the reflective array and reflect back to the output transducer to be coherently collected.

BRIEF DESCRIPTION OF THE DRAWINGS

The invention will be more fully appreciated from the following detailed description when the same is considered in connection with the accompanying drawings in which.

DETAILED DESCRIPTION

Figure 1:
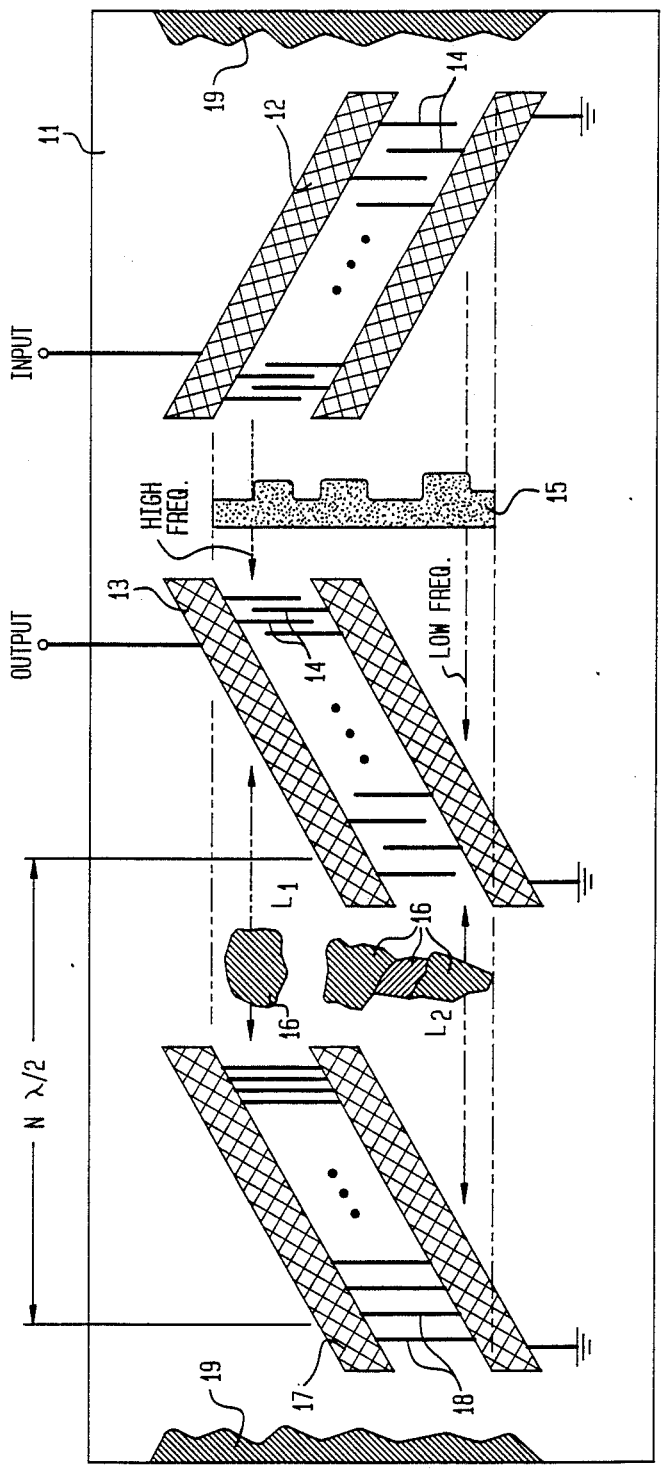
FIG. 1 illustrates a SAW-SAC device in accordance with the present invention.

Turning now to FIG. 1 of the drawings, there is shown a SAW-SAC device comprising a piezoelectric substrate 11 and a pair of conventional, dispersive interdigital transducers 12 and 13 for signal input/output purposes. In a preferred embodiment, a SAW-SAC substrate of lithium niobate is desirable. The invention, however, should in no way be construed as limited to this substrate and other known piezoelectric substrate materials (e.g. quartz) may be utilized in practicing the principles of the present invention. The input and output transducers, as well as the reflective grating to be described, are photo-etched in thin-film metal (i.e., aluminum) to produce a rugged monolithic device. The photolithographic process is itself a well-known method of fabrication. The input transducer 12 and output transducer 13 are aligned with each other on the substrate 11 and are slanted at equal and opposite appropriate angles to each other. The angle of emplacement is well known in the art, although the transducers are figuratively shown at approximately ±45°. Each transducer, 12 and 13, comprises a plurality of interdigital electrodes 14, the periodicity varying in a predetermined manner along the length of each transducer and the periodicity being the same in corresponding parts of each transducer. The periodicity variation of the electrodes 14, will be a linear function of frequency.

As displayed in FIG. 1, the SAW-SAC device produces a down chirped waveform, the slope of which is determined by the relative delay of the various frequencies. When the above-mentioned down-chirp signal is fed into a conjugate (i.e. matched) up-chirp device, a compressed pulse will appear at the output.

A thin-film phase correction stripe 15, may be disposed halfway between the input transducer and the output transducer to compensate for phase errors. By properly choosing the profile of the metal film, the phase of all the frequency components can be shifted relative to each other and phase-error compensation effected.

Located adjacent to the output transducer on the side thereof opposite that of the input transducer is an acoustic absorbing or attenuating film 16. The film is of constant thickness and, as figuratively shown, varies in width. The invention should in no way be construed as limited to any particular acoustic absorbing material. The profile of the absorbing film is dependent upon the amount of amplitude compensation needed at the output transducer. A wider segment of absorbing film will absorb a greater portion of the signal as opposed to a segment of lesser width or even zero width where no absorbing film would exist.

Located adjacent to the acoustic absorbing film on the side thereof opposite that of the output transducer is a reflective array 17. The reflective array, disposed on the substrate at an angle equal to that of the output transducer, comprises a plurality of shorted interdigital electrodes 18, the periodicity of which corresponds to that of the output transducer. The reflective array is at a distance equal to $N\lambda/2$ from the output transducer, where N is an integer and $\lambda$ is wavelength. Acoustic absorbers 19 may be disposed near the ends of substrate 11 adjacent to input transducer 12 and reflective array 17, to absorb waves emanating in the direction away from the input transducer and away from the reflective array thereby absorbing edge reflections. Thus, reflection of the waves back to the input transducer and the reflective array is prevented, subsequently preventing further errors in the output signal.

During actual operation, a signal delivered to the input transducer 12 will cause a dispersive-type signal to be propagated in the SAW-SAC device toward the phase correction stripe 15, if present, and will continue to the output transducer. At this point the acoustic signal is partially coupled to an electrical load, partially reflected back to the input, and partially transmitted through the output transducer. In conventional prior art SAW-SAC devices, that portion of the acoustic signal that travels through the output transducer is wasted and usually absorbed. Within the scope of the present invention, the "leakage" signal ($L_1$ or $L_2$) is used to selectively compensate the device amplitude ripple response by reflecting certain portions of the acoustic signal corresponding to frequencies where the amplitude response "dips". The "leakage" signal continues to the reflective array 17 where it is reflected back to the output transducer 13. The reflected signal from the reflective array is in-phase with the output signal due to the separation distance from the output transducer of $N\lambda/2$, thus it will add coherently at the output transducer. The "leakage" signal will be totally reflected by the reflective array where there is no acoustic absorbing film present. The signal will be transmitted to the output transducer where it will be coherently added. In the regions where the acoustic absorbing film is present, a portion of the signal will be absorbed or attenuated. Actual determination of the desired reflective characteristics is performed by measuring the initial uncompensated amplitude response, analyzing the "dips" in the frequency response and compensating for it at the respective frequencies. An acoustic absorbing film will be disposed where there is little or no amplitude compensation needed. Gaps in the acoustic absorbing film will be present where maximum compensation is needed allowing the signal to pass to the reflective array.

Figure 2:
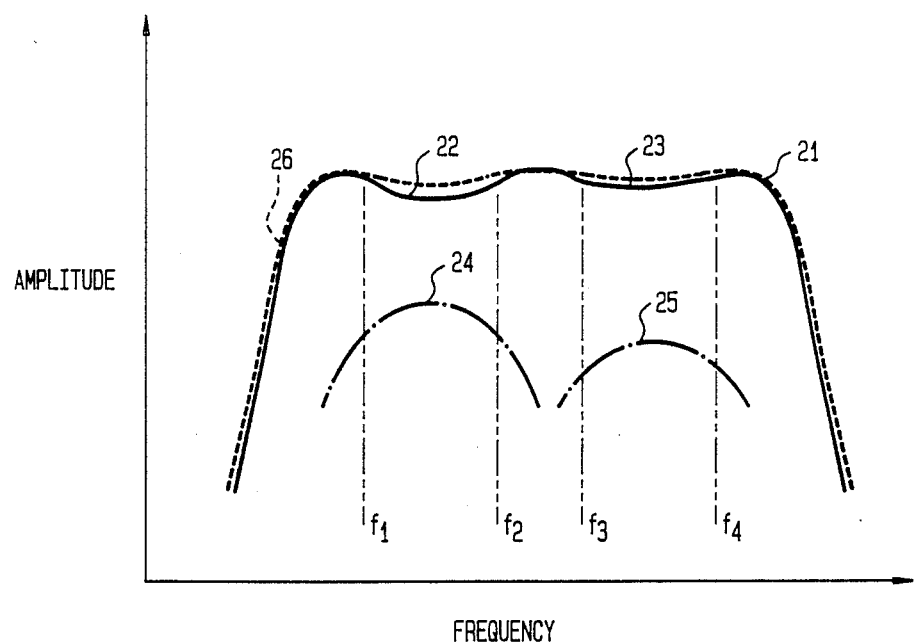
FIG. 2 shows a SAW-SAC device amplitude vs. frequency response with and without compensation.

FIG. 2 displays a frequency vs. amplitude response. The solid curve 21 represents the amplitude response without compensation, (e.g. the SAW-SAC device has no acoustic absorbing film and no reflective array to compensate for amplitude errors). The "dips" in the amplitude response 22 and 23 of the solid curve 21 correspond to gross amplitude errors. In order to provide the proper compensation, an acoustic absorbing film would be designed (via experiment and computation) to absorb the desired amount of signal in the frequency regions where there are no "dips". The acoustic absorbing film would have gaps or thinned portions at the designated frequency regions (e.g. $f_1$–$f_2$, $f_3$–$f_4$) where dips occur, so that the signal would continue to the reflective array and would be transmitted back to the output transducer. Frequency responses 24 and 25 would coherently add to the uncompensated response 21 to achieve an improved amplitude response, dotted curve 26. As the amplitude errors become minimal, time-sidelobe performance of the device is improved.

Having shown and described what is at present to be the preferred embodiments of the invention, it should be understood that the same has been shown by way of illustration and not limitation. And, all modifications, alterations and changes coming within the spirit and scope of the invention are meant to be included herein.

What is claimed is:

1. A surface acoustice wave device comprising:
    a piezoelectric substrate for prolongating surface acoustic waves;
    an input and an output interdigital transducer aligned at predetermined equal and opposite angles to each other; each transducer having a plurality of interdigital electrodes, the periodicity of which varies in a predetermined manner along the length of each transducer, the periodicity variation being the same for corresponding portions of the two transducers;
    a reflective array aligned with said interdigital transducers and positioned on said substrate a distance from said output transducer on the side thereof opposite that of said input transducer;
    a reflective array aligned with said interdigital transducers and positioned on said substrate a distance from said output transducer on the side thereof opposite that of said input transducer;
    said reflective array being disposed on said substrate at an angle the same as that of said output transducer, the distance between the electrodes of said reflective array and the electrodes of said output transducer being equal to $N\lambda/2$, where N is an integer and $\lambda$ is acoustic wavelength corresponding to the frequency of operation; and
    an acoustic absorbing film aligned on said substrate intermediate between said output transducer and said reflective array;
    said acoustic absorbing film having a non-uniform width.

2. The surface acoustic wave device as defined in claim 1 further comprising a thin-film phase correction strip disposed halfway between said input and output transducer.

3. The surface acoustic wave device of claim 2 further comprising means for absorbing acoustic waves disposed on said substrate edges.

4. The surface acoustic wave device of claim 3 wherein N may be equal to 1, 2, 3 . . . .

5. The surface acoustic wave device as defined in claim 4 wherein said transducers and said reflective array are photo-etched in thin film metal on said substrate.

* * * * *